United States Patent
Jose et al.

(10) Patent No.: US 9,369,920 B2
(45) Date of Patent: Jun. 14, 2016

(54) DEGREE REDUCTION AND DEGREE-CONSTRAINED COMBINING FOR RELAYING A FOUNTAIN CODE

(71) Applicant: QUALCOMM Incorporated, San Diego, CA (US)

(72) Inventors: Jubin Jose, Bound Brook, NJ (US); Chong Li, Piscataway, NJ (US); Xinzhou Wu, Monmouth Junction, NJ (US); Sundar Subramanian, Bridgewater, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 66 days.

(21) Appl. No.: 14/292,359

(22) Filed: May 30, 2014

(65) Prior Publication Data

US 2014/0369253 A1    Dec. 18, 2014

Related U.S. Application Data

(60) Provisional application No. 61/834,122, filed on Jun. 12, 2013.

(51) Int. Cl.
| | |
|---|---|
| *H04W 28/06* | (2009.01) |
| *H04W 4/00* | (2009.01) |
| *H03M 13/37* | (2006.01) |
| *H04L 1/00* | (2006.01) |

(52) U.S. Cl.
CPC ........ *H04W 28/065* (2013.01); *H03M 13/3761* (2013.01); *H04L 1/0041* (2013.01); *H04L 1/0058* (2013.01); *H04L 1/0076* (2013.01); *H04W 4/008* (2013.01); *H04L 2001/0097* (2013.01)

(58) Field of Classification Search
None
See application file for complete search history.

(56) References Cited

U.S. PATENT DOCUMENTS

| | | | |
|---|---|---|---|
| 6,804,516 B2 | 10/2004 | Choi | |
| 6,870,861 B1* | 3/2005 | Negishi | H04J 3/1641 370/537 |
| 2011/0299629 A1* | 12/2011 | Luby | H03M 13/3761 375/299 |
| 2012/0128009 A1* | 5/2012 | Yang | H03M 13/2906 370/432 |
| 2012/0246538 A1 | 9/2012 | Wu | |
| 2012/0284581 A1* | 11/2012 | Larsson | H04L 1/1845 714/749 |
| 2014/0369250 A1* | 12/2014 | Ren | H04L 1/0077 370/312 |
| 2014/0369253 A1* | 12/2014 | Jose | H04W 28/065 370/315 |

FOREIGN PATENT DOCUMENTS

CN             102237966 A      11/2011

OTHER PUBLICATIONS

"Optimal Degree Distribution for LT Codes with Small Message Length"; Hyytia et al. IEEE Infocom; 2007.*

(Continued)

*Primary Examiner* — Benjamin H Elliott, IV
(74) *Attorney, Agent, or Firm* — Arent Fox LLP

(57) ABSTRACT

A method, an apparatus, and a computer program product for relaying a packet are provided. The apparatus receives at least one packet and reduces a degree of the at least one packet. The apparatus further processes the at least one packet based on the reduced degree, generates a combined packet by combining the at least one processed packet with at least one other processed packet based on the reduced degree and a weight of each of the processed packets, and transmits the combined packet.

28 Claims, 6 Drawing Sheets

(56) References Cited

OTHER PUBLICATIONS

"Vehicle Information Exchange Needs for Mobility Applications"; Intelligent Transportation Systems Joint Program Office; Feb. 13, 2012.*

"Degree Distribution of XORed Fountain Codes: Theoretical Derivation and Analysis"; Nodin et al.; 2010 16th Asia-Pacific Conference on Communications; 2010.*

Champel, M.-L. et al., "LT Network Codes", Distributed Computing Systems (ICDCS), 2010 IEEE 30th International Conference on, Jun. 21-25, 2010, Genova, IEEE, pp. 536-546,XP032393187.

International Search Report and Written Opinion—PCT/US2014/040471—ISA/EPO—Aug. 27, 2014.

Li C., et al., "Distributed-fountain network code (DFNC) for content delivery in vehicular networks," Proceeding of the tenth ACM international workshop on Vehicular inter-networking, systems, and applications, 2013, pp. 31-40.

Mahdaviani K. et al., "On Raptor Code Design for Inactivation Decoding", Communications, IEEE Transactions on, vol. 60, No. 9, IEEE, IEEE Communications Society, Sep. 2012, pp. 2377-2381, XP011463094.

Palma V., et al., "A fountain codes-based data dissemination technique in vehicular Ad-hoc networks," 11th International Conference on ITS Telecommunications (ITST), 2011, pp. 750-755.

Shirvanimoghaddam M. et al., "Distributed Rateless Coding with Cooperative Sources", Information Theory Proceedings (ISIT), 2012 IEEE International Symposium on, Jul. 1-6, 2012, IEEE, pp. 488-492, XP032225927.

Xuehong L. et al., "Designing of Fountain Codes in Cooperative Relay Systems", Networks Security Wireless Communications and Trusted Computing (NSWCTC), 2010 Second International Conference on, vol. 2, Apr. 24-25, 2010, IEEE, pp. 146-149, XP031687066.

Yang J. et al., "Energy Efficient Data Gathering Based on Distributed iLT Coding", Communications and Information Technologies (ISCIT), 2011 11th International Symposium on, Oct. 12-14, 2011, Hangzhou, pp. 466-471, XP032027670.

* cited by examiner

DEGREE REDUCTION AND DEGREE-CONSTRAINED COMBINING FOR RELAYING A FOUNTAIN CODE

CROSS-REFERENCE TO RELATED APPLICATION(S)

This application claims the benefit of U.S. Provisional Application Ser. No. 61/834,122, entitled "DEGREE REDUCTION AND DEGREE-CONSTRAINED COMBINING FOR RELAYING A FOUNTAIN CODE" and filed on Jun. 12, 2013, which is expressly incorporated by reference herein in its entirety.

BACKGROUND

1. Field

The present disclosure relates generally to communication systems, and more particularly, to a method and apparatus for relaying a fountain code using degree reduction and degree-constrained combining.

2. Background

Dedicated short-range communications (DSRC) is a two-way short-to-medium-range wireless communications capability that permits very high data transmission critical in communications-based active safety applications. For example, DSRC may be implemented using the IEEE 802.11p standard, which adds wireless access in vehicular environments (WAVE) and may support Intelligent Transportation Systems (ITS) applications.

DSRC includes a message format (e.g., basic safety message (BSM) format) which may be used by vehicles to send and receive messages. For example, a vehicle may transmit a BSM to periodically announce its position, velocity and other attributes to other vehicles. The other vehicles may then receive the BSM and track the position of the transmitting vehicle and, therefore, may avoid collisions and improve traffic flow.

DSRC may also allow vehicles to communicate with roadside units (RSUs) to receive urgent information through roadside alert messages. A vehicle may largely rely on roadside alert messages from RSUs to detect public safety information, such as hazardous road conditions or police activity.

SUMMARY

In an aspect of the disclosure, a method, a computer program product, and an apparatus are provided. The apparatus receives at least one packet and reduces a degree of the at least one packet. The apparatus further processes the at least one packet based on the reduced degree and generates a combined packet by combining the at least one processed packet with at least one other processed packet based on the reduced degree and a weight of each of the processed packets. Thereafter, the apparatus transmits/broadcasts the combined packet.

DETAILED DESCRIPTION

Figure 1:
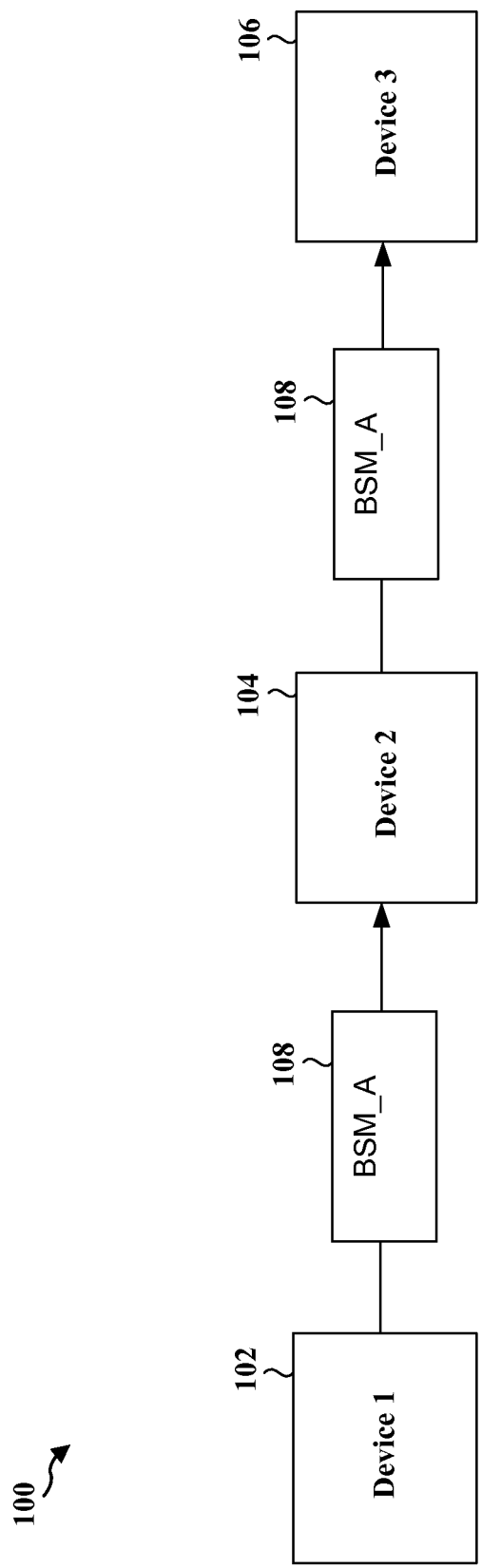
FIG. 1 is a diagram illustrating a communication system.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of communication systems will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), and floppy disk where disks usually reproduce data magnetically, while discs reproduce data optically with lasers. Combinations of the above should also be included within the scope of computer-readable media.

In situations where vehicles cannot communicate with RSUs to receive urgent information (e.g., public safety information), vehicles may need to receive the urgent information from BSMs transmitted from other nearby vehicles. In accordance with the aspects described herein, for example, a police vehicle may be configured to use a motorist vehicle in traffic as a relay for disseminating to other nearby vehicles information relating to a nearby police pursuit. As another example, an ambulance may use the motorist vehicle as a relay for disseminating yield information to other nearby vehicles. As another example, a vehicle may receive road construction and detour information relayed from other vehicles.

FIG. 1 is a diagram illustrating a communication system 100. As shown in FIG. 1, the communication system 100 includes device 1 102, device 2 104, and device 3 106. In an aspect, the device 1 102, device 2 104, and device 3 106 may each be a wireless communication device configured to transmit and receive messages based on DSRC protocols. In such aspect, the device 1 102, device 2 104, and device 3 106 may each be installed in a different vehicle.

As shown in FIG. 1, the device 1 102 may send a message or BSM 108 (referred to as "BSM_A" in FIG. 1) to device 2 104. The device 2 104 may receive the BSM 108 and determine control information associated with the BSM 108. For example, the control information may include public safety information, traffic delay information, detour information, a desired transmission direction, a destination, and/or weather information. As further shown in FIG. 1, the device 2 104 may then transmit the BSM 108 to the device 3 106 based on the determined control information. For example, if the control information indicates that the current weather conditions include heavy snowfall, the device 2 104 may transmit the BSM 108 to the device 3 106 with increased transmission power to successfully deliver the BSM 108 to the device 3 106 in such weather conditions. As another example, if the control information indicates that the BSM 108 is to be transmitted to a particular destination, such as a nearby school, the device 2 104 may transmit the BSM 108 to a wireless communication device (e.g., device 3 106) situated at such destination. Therefore, the device 2 104 may relay the BSM 108 received from device 1 102 to device 3 106 based on the control information.

In an aspect, the device 2 104 may determine a relative location of one or more devices (e.g., device 3 106). For example, the device 2 104 may determine the relative location of a device using position information received in a BSM from the device. The device 2 104 may then transmit the BSM 108 to one or more devices based on the relative locations of the devices. For example, the relative location may be represented as GPS coordinates or as a direction with respect to the device 2 104, such as north or southwest. In a further aspect, the device 2 104 may relay the BSM 108 by broadcasting the BSM 108 to the device 3 106 and any other devices capable of receiving the BSM 108.

In an aspect, the device 1 102 may be granted authority to generate BSMs (also referred to as "controlled BSMs," "enhanced BSMs," or "high priority BSMs") having a higher priority than BSMs generated by devices that have not been granted such authority. For example, the authority to generate high priority BSMs may be granted to government entities, such as police departments. A wireless communication device that receives and authenticates a high priority BSM may be said to be granted local authority.

Figure 2:
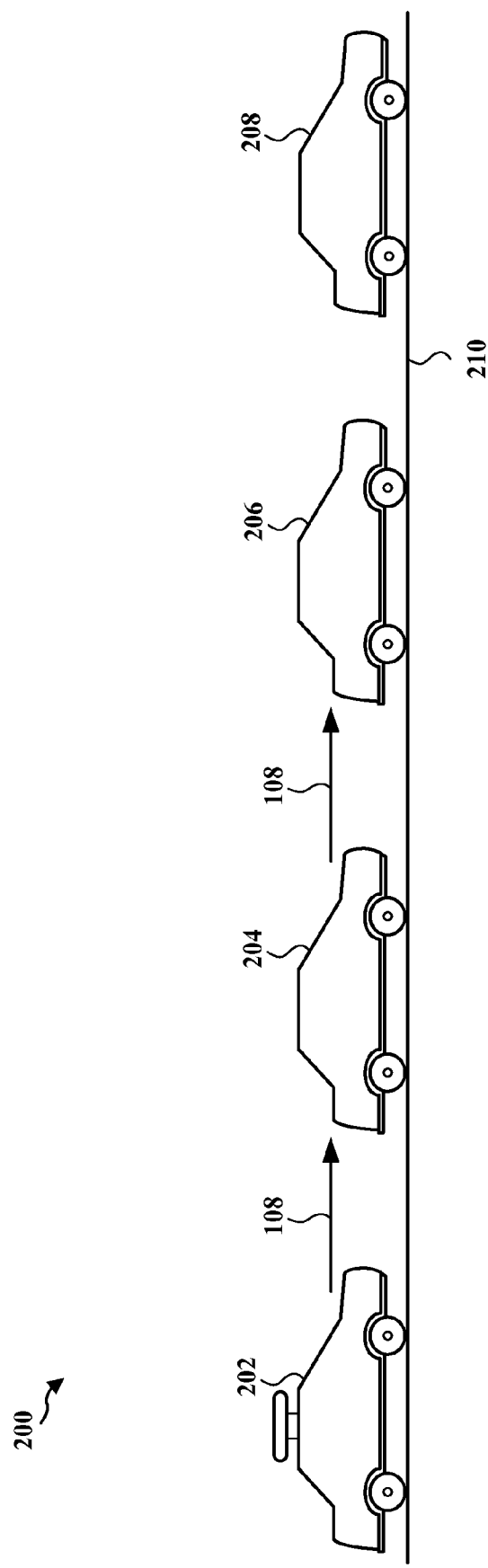
FIG. 2 is an example implementation of a communication system.

FIG. 2 is an example implementation of the communication system 100. Referring to FIG. 2, BSM transmissions are illustrated. FIG. 2 includes a first vehicle 202. A second vehicle 204, a third vehicle 206, and a fourth vehicle 208 travel ahead of the first vehicle 202 on a street 210. For example, the device 1 102 may be installed in the first vehicle 202, the device 2 104 may be installed in the second vehicle 204, and the device 3 106 may be installed in the third vehicle 206. In this example, the first vehicle 202 may be involved in a high speed pursuit of the fourth vehicle 208. In an aspect, the second vehicle 204 may specifically relay the BSM 108 received from the first vehicle 202 to the third vehicle 206. In a further aspect, the second vehicle 204 may broadcast the BSM 108 such that the fourth vehicle 208 may receive the BSM 108 as well as the third vehicle 206.

The deployment of vehicle-to-vehicle (V2V) communications is primarily driven by safety. However, cellular infrastructure and RSUs may utilize V2V communications to deliver content that is destined for vehicles, homes, and/or fixed delivery locations. DSRC may have several channels allocated for non-safety services, ranging from office-on-wheels to peer-to-peer (P2P) file sharing and navigation software updates. Thus, content delivery in vehicular networks equipped with DSRC has the advantage of utilizing DSRC spectrum. Other advantages include support for high mobility and potential ubiquitous deployment. Distribution of a Certificate Revocation List (CRL) created by a certificate authority to all vehicles may also be provided.

V2V communications utilizing DSRC may enable large scale content delivery over small and large geographical areas. While content delivery in such vehicular networks can take advantage of the broadcast nature of DSRC, challenges arise with respect to dynamic topology, unpredictable erasures, and lack of acknowledgements. Random linear network coding (RLNC) may be able to address these challenges. However, high decoding complexity associated with RLNC limits its applicability, especially for large scale content delivery.

A low complexity approach for a specific scenario of a single source without relays is fountain code. However, it is desirable to develop a technique to relay the fountain code. The present disclosure describes a technique for relaying the fountain code that can be implemented with low complexity algorithms.

A network coding scheme for vehicular networks, such as distributed-fountain network code (DFNC), has low encoding, re-encoding, and decoding complexity. DFNC uses a fountain code at the source and re-encoding at intermediate vehicles that approximate the fountain code. Re-encoding at intermediate vehicles includes low complexity degree reduction and random linear combination of degree-reduced packets to satisfy the degree distribution of the fountain code. Low-complexity belief propagation (BP) decoding is applied at the destinations.

Figure 3:
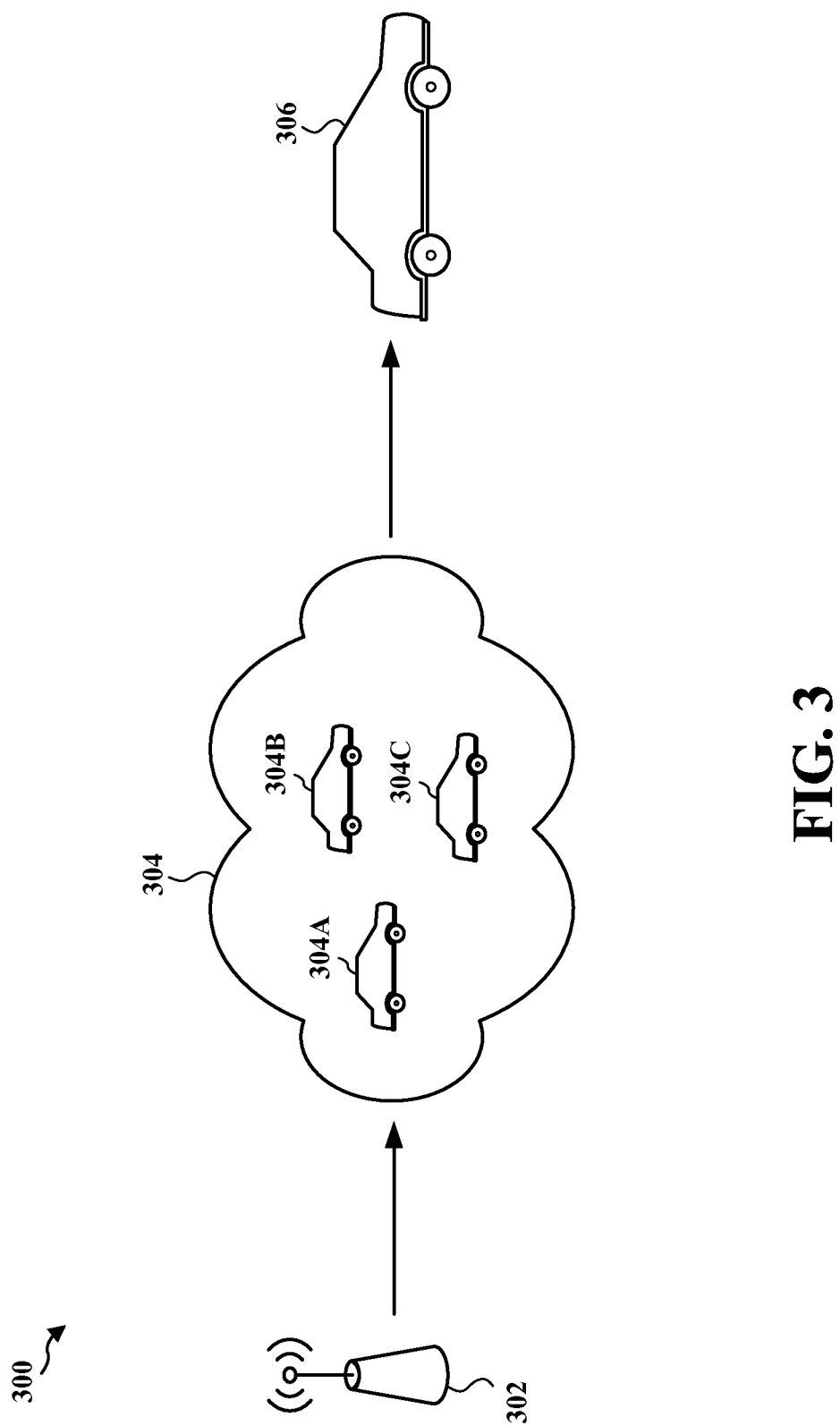
FIG. 3 is a diagram illustrating a network for relaying a fountain code.

FIG. 3 is a diagram 300 illustrating a network for relaying a fountain code. Referring to FIG. 3, a source (e.g., cellular base station, RSU) 302 may have a file including k packets. Each packet may be a length-1 binary vector. The source 302 may intend to send the same file to one or more destinations 306 through a wirelessly connected vehicular network 304. The source 302 encodes native packets using a fountain code and injects the encoded packets into the vehicular network 304 for a limited duration. The present disclosure describes a method for relaying at intermediate nodes (e.g., vehicles 304A, 304B, and 304C) that achieves quality file-broadcasting delay distribution.

At any given time, each intermediate vehicle (or relay) may have a set of received packets in a buffer. Each packet in the buffer may be a linear combination of a set of native packets. The number of native packets used to create each packet may be referred to as a degree. When the relay has an opportunity to transmit a packet, the relay performs the following two steps: 1) degree reduction; and 2) degree-constrained combining. This two stage approach provides sufficient diversity in relaying.

In degree reduction, the net degree of packets received by the relay is reduced. Moreover, the fact that multiple packets may have the same native packet is utilized. A low complexity approach (e.g., low complexity algorithms) may be used. For example, packets having a degree of one (degree-1 packets) and packets having a degree of two (degree-2 packets) may be used in an efficient manner to perform degree reduction of all packets. The degree reduction may be performed on all packets newly received by the relay or a subset of all the packets in the relay buffer. Degree reduction minimizes the degree of the packets to allow for a large number of packet choices to perform degree-constrained combining.

In an aspect, degree-1 packets may be used for belief propagation. This may be an iterative step that utilizes new degree-1 packets. Degree-2 packets may be used to form an equivalence class. Any two native packets in an equivalence class can be obtained by XOR-ing (performing an exclusive-or operation on) degree-2 packets. This property may be used to remove such combinations from higher degree packets. Higher degree packets may also be used for degree reduction. Limiting the computational complexity is key while using the higher degree packets.

An equivalence class may be defined as follows:

Equivalence Class—Given a set of encoded packets $\{y_i\}_{i=1}^r$, an induced class E is a set of unique native packets satisfying the following condition. If $x_a, x_b \in E$, then there exists a set of degree-2 encoded packets $\Gamma \subseteq \{1, \ldots, r\}$ such that $x_a \oplus x_b = \oplus_{i \in \Gamma} y^i$.

A given set of encoded packets may induce several equivalence classes. The equivalence class is defined using degree-2 packets only.

In an aspect, degree reduction with low-complexity may be provided.

Accordingly, a decoded set D, which is the set of decoded native packets, and equivalence classes may be utilized to perform degree reduction. The decoded set and equivalence classes maybe defined with respect to a current set of degree-reduced packets.

For degree reduction, when a new packet is received by an intermediate node (or relay), all native packets in the new packet that belong to the decoded set D are removed. Next, the intermediate node checks if there are any two of the native packets in the new packet that belong to the same equivalence class. If so, this pair of native packets is removed by adding the same pair generated from the corresponding equivalence class. This process may be repeated until no such pair of native packets in the new packet can be removed. If the degree-reduced new packet has a degree less than or equal to two, the decoded set D and equivalence classes are updated as follows. If the degree of the degree-reduced new packet is equal to one, the intermediate node proceeds further with belief propagation (BP) decoding. Thereafter, the decoded set D and equivalence classes are updated. If the degree of the degree-reduced new packet is equal to two, equivalence classes are updated. After degree reduction, encoded packets with a high degree become packets with a lower degree.

An example of an algorithm (Algorithm 1) for low-complexity degree reduction, where NE represents a number of equivalence classes, may be as follows:

---

Algorithm 1: Low-Complexity Degree Reduction

Input: $y_{r+1}, \{y_i\}_{i=1}^r$, D and $\{E_i\}_{i=1}^{NE}$
Output: $\{y_i\}_{i=1}^{r+1}$, D and $\{E_i\}_{i=1}^{NE}$
1: $y_{r+1} \leftarrow$ reduce the degree of $y_{r+1}$ by D and $\{E_i\}_{i=1}^{NE}$.
2: if $\deg(y_{r+1}) = 1$ then
3:     $\{y_i\}_{i=1}^{r+1} \leftarrow$ BP decoding
4:     update $\{E_i\}_{i=1}^{NE}$ and D
5: end if
6: if $\deg(y_{r+1}) = 2$ then
7:     update $\{E_i\}_{i=1}^{NE}$
8: end if

---

In degree-constrained combining, a packet for transmission is generated by combining degree-reduced packets based on a given/appropriate degree distribution. More specifically, the degree distribution of the fountain code can be used. For any given degree, packets with a degree lower than or equal to the given degree are selected based on weights assigned to the packets. The weight assignment can be time varying based on previously selected packets. This process may continue until a target degree is reached or a maximum number of selections are exhausted. Each packet generated through this approach can be further diversified using the set of degree-1 packets and the equivalence class formed by the degree-2 packets.

In an aspect of degree-constrained combining, when an intermediate node (or relay) intends to produce a new packet to broadcast, the intermediate node first picks a target degree d at random from a distribution (e.g., Robust Soliton (RS) distribution or other optimized degree distribution). Next, the intermediate node constructs a new packet with a degree d as follows. First, a packet is randomly selected with a degree less than or equal to d. Let this degree be d'. Next, a packet is randomly selected with a degree less than or equal to d-d'. This process may continue until the target degree is reached or a maximum number of steps are used. The degree of the sum of two encoded packets need not be the sum of their respective degrees. While selecting a packet, degree reduction using equivalence classes may be applied. The reason for applying the degree reduction is that the decoded set and the equivalence classes may have drastically changed compared to the time while the packet was received.

The packets with degree less than or equal to a target degree d may be randomly selected according to a pre-assigned distribution. The distribution may be generated by normalizing weight assignments in the set $S(d) = \{y \in Y | \deg(y) \le d\}$. Let z be the newly re-encoded packet. Weight assignment allows a weight to be assigned to each $y \in z$ such that the encoded packets are selected with a low/zero probability in future transmissions. In particular, the initial value of $W(y)$ may be set to one (i.e., y has never been used to produce any re-encoded packet). Then, if y is selected to construct z (i.e., $y \in z$), $W(y)$ is updated to $W(y)e^{-c}$ for some constant c.

An example of a pseudo-code of the distribution-based packet construction, where NE represents a number of equivalence classes, is presented in Algorithm 2 below:

---

Algorithm 2: Distribution-based Packet Construction

Input: k, d, S(d), W, $i_{max}$, D and $(E_i)_{i=1}^{NE}$
Output: z, W
1: $z \leftarrow \emptyset, i \leftarrow 0$
2: while $\deg(z) < d$ and $i < i_{max}$ do
3:     $i \leftarrow i + 1$
4:     if $S(d) \ne \emptyset$ then
5:         z' $\leftarrow$ randomly select a packet y from set S(d) according to W

| Algorithm 2: Distribution-based Packet Construction |
| --- |
| 6:         $z' \leftarrow$ further degree reduction on $z'$ by equivalence class $(E_i)_{i=1}^{NE}$ |
| 7:         if $d(z) \leq \deg(z \oplus z') \leq d$ then |
| 8:             $d \leftarrow d - \deg(z \oplus z')$ |
| 9:             $z \leftarrow z \oplus z'$ |
| 10:        end if |
| 11:        else |
| 12:            break; // re-select a degree d with $S(d) \neq 0$ |
| 13:        end if |
| 14: end while |
| 15:   $C_y(z) \leftarrow \{y \in Y | y \in z\}$ // used for weight update |
| 16: if Size(D) $\leq$ ¼ k then |
| 17:       for all $y \in C_y(z)$ do |
| 18:           $W(y) \leftarrow W(y)e^{-c}$// weight update |
| 19:       end for |
| 20: end if |

Since degree reduction in Algorithm 1 may be only partial, the packet construction process in Algorithm 2 may benefit from further packet diversification. Diversification allows a native packet x in the newly re-encoded packet z to be replaced with another native packet x'. The replacement can be performed efficiently if x and x' are in the decoded set or in the same equivalence class (denoted by x'~x). In order to maximize packet diversity, the native packet x' in the decoded set or the equivalence class may be selected uniformly at random. For x' chosen from the equivalence class, $x \oplus x'$ can be generated by using currently available degree-2 encoded packets. Let equivalence chain $C_y(x, x')$ of $(x, x')$ be a set of packets with the sum equal to $x \oplus x'$. Finding this equivalence chain for a pair (x, x') may essentially be a tree search algorithm.

An example of an algorithm (Algorithm 3) for packet diversification, where NE represents a number of equivalence classes, may be as follows:

| Algorithm 3: Packet Diversification |
| --- |
| Input: z, D and $(E_i)_{i=1}^{NE}$ |
| Output: z |
| 1: for all $x \in z$ do |
| 2:       $A \leftarrow \{x' \in X | x' \sim x$ and $x' \notin z\}$ |
| 3:       if $A \neq \emptyset$ then |
| 4:          $x' \leftarrow$ uniform randomly select a x' from A |
| 5:          $C_y(x,x') \leftarrow \{y \in Y | x \oplus x' = \oplus_{i=1}^{h} y_i, \deg(y_i) \leq 2\}$ |
| 6:          // construct equivalence chain |
| 7:       end if |
| 8: end for |

Figure 4:
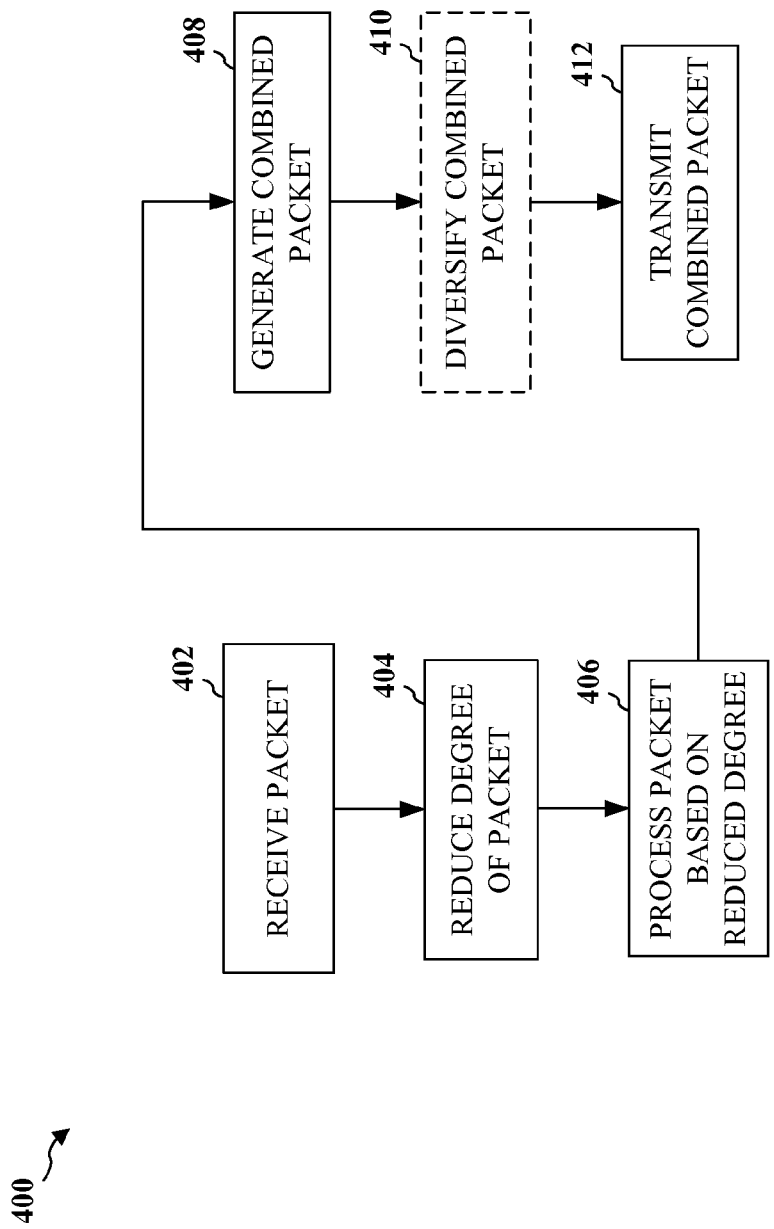
FIG. 4 is a flow chart of a method of relaying a packet.

FIG. 4 is a flow chart 400 of a method of relaying a packet. The method may be performed by an intermediate node or relay (e.g., the device 2 104 in FIG. 1 or the second vehicle 204 in FIG. 2). At step 402, the intermediate node receives at least one packet. The at least one packet may be received from a source (e.g., the device 1 102 in FIG. 1 or the first vehicle 202 in FIG. 2) or another intermediate node or relay. Moreover, the at least one packet received may be encoded using a fountain code.

At step 404, the intermediate node reduces a degree of the at least one packet. The degree of the at least one packet refers to a number of native packets used to create the at least one packet. The intermediate node may reduce the degree by removing all native packets of the at least one packet that belong to a decoded set of native packets. Additionally or alternatively, the intermediate node may reduce the degree by removing any combination of two native packets of the least one packet that belong to a same equivalence class. Notably, an equivalence class refers to a set of native packets, wherein an exclusive-or operation of any two native packets in the equivalence class can be generated by performing an exclusive-or operation on degree-2 processed packets.

At step 406, the intermediate node processes the at least one packet based on the reduced degree. For example, the processing may include the intermediate node determining the reduced degree of the at least one packet. When the reduced degree of the at least one packet is equal to one, the intermediate node may update the decoded set with the at least one degree-reduced packet, update the decoded set based on belief propagation, and update equivalence classes based on the at least one degree-reduced packet. When the reduced degree of the at least one packet is equal to two, the intermediate node may update the equivalence classes based on the at least one degree-reduced packet.

At step 408, the intermediate node may generate a combined packet. Generating the combined packet may include combining the at least one processed packet with at least one other processed packet based on the reduced degree and a weight of each of the processed packets. For example, generating the combined packet may include determining a target degree for the combined packet and selecting at least one degree-reduced packet having a degree less than or equal to the target degree based on a weight assigned to each packet of the at least one packet. The at least one degree-reduced packet may be selected until a sum of respective degrees of selected packets is equal to the target degree, or until a maximum number of selections has occurred. Thereafter, the intermediate node may combine each of the at least one selected degree-reduced packet to generate the combined packet.

At step 410, the intermediate node may diversify the combined packet. Diversifying the combined packet may include replacing a native packet in the combined packet with another native packet from the decoded set of native packets. Diversifying may also include replacing any native packet in the combined packet with another native packet that belongs to a same equivalence class. At step 412, the intermediate node may transmit/broadcast the combined packet to a destination or relay (e.g., the device 3 106 in FIG. 1 or the third vehicle 206 and/or the fourth vehicle 208 in FIG. 2).

Figure 5:
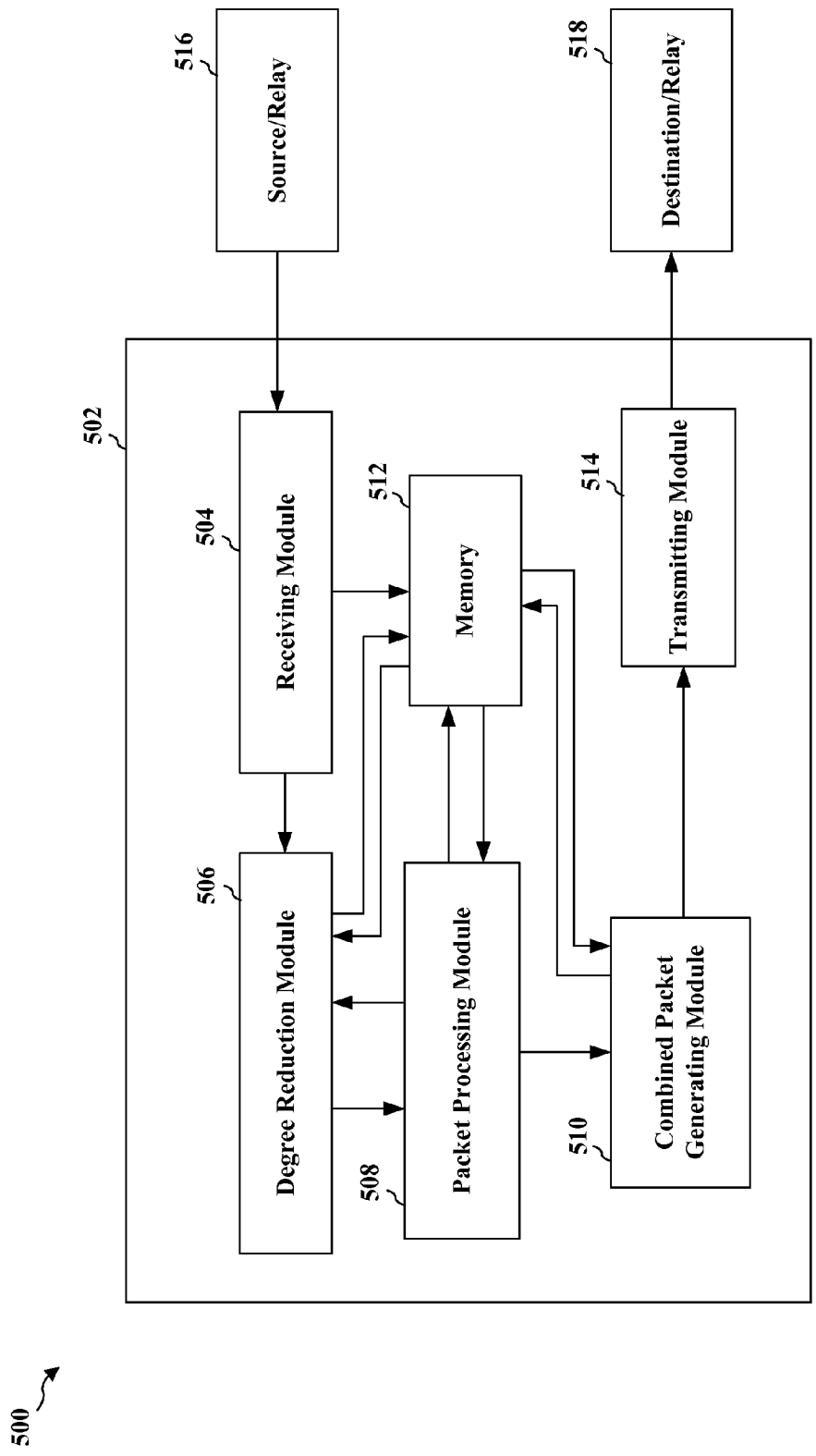
FIG. 5 is a conceptual data flow diagram illustrating the data flow between different modules/means/components in an exemplary apparatus.

FIG. 5 is a conceptual data flow diagram 500 illustrating the data flow between different modules/means/components in an exemplary apparatus 502. The apparatus may be an intermediate node or relay (e.g., the device 2 104 in FIG. 1 or the second vehicle 204 in FIG. 2). The apparatus includes a receiving module 504, a degree reduction module 506, a packet processing module 508, a combined packet generating module 510, a memory 512, and a transmitting module 514.

The receiving module 504 receives at least one packet. The at least one packet may be received from a source or relay 516. Moreover, the at least one packet received may be encoded using a fountain code.

The degree reduction module 506 reduces a degree of the at least one packet. The degree of the at least one packet refers to a number of native packets used to create the at least one packet. The degree reduction module 506 may reduce the degree by removing all native packets of the at least one packet that belong to a decoded set of native packets. The decoded set of native packets may be stored in the memory 512. Additionally or alternatively, the degree reduction module 506 may reduce the degree by removing any combination of two native packets of the least one packet that belong to a same equivalence class. Equivalence classes may also be stored in the memory 512. Notably, an equivalence class refers to a set of native packets, wherein an exclusive-or operation of any two native packets in the equivalence class can be generated by performing an exclusive-or operation on degree-2 processed packets.

The packet processing module 508 processes the at least one packet based on the reduced degree. For example, the processing may include the packet processing module 508 determining the reduced degree of the at least one packet. When the reduced degree of the at least one packet is equal to one, the packet processing module 508 may update the decoded set stored in the memory 512 with the at least one degree-reduced packet, update the decoded set stored in the memory 512 based on belief propagation, and update equivalence classes stored in the memory 512 based on the at least one degree-reduced packet. When the reduced degree of the at least one packet is equal to two, the packet processing module 508 may update the equivalence classes stored in the memory 512 based on the at least one degree-reduced packet.

The combined packet generating module 510 may generate a combined packet. Generating the combined packet may include combining the at least one processed packet with at least one other processed packet based on the reduced degree and a weight of each of the processed packets. For example, generating the combined packet may include the combined packet generating module 510 determining a target degree for the combined packet and selecting at least one degree-reduced packet having a degree less than or equal to the target degree based on a weight assigned to each packet of the at least one packet. The combined packet generating module 510 may select the at least one degree-reduced packet until a sum of respective degrees of selected packets is equal to the target degree, or until a maximum number of selections has occurred. Thereafter, the combined packet generating module 510 may combine each of the at least one selected degree-reduced packet to generate the combined packet.

The combined packet generating module 510 may also diversify the combined packet. Diversifying the combined packet may include replacing a native packet in the combined packet with another native packet from the decoded set of native packets stored in the memory 512. Diversifying may also include replacing any native packet in the combined packet with another native packet that belongs to a same equivalence class stored in the memory 512. Thereafter, the combined packet generating module 510 may transmit/broadcast (via the transmitting module 514) the combined packet to a destination or relay 518 (e.g., the device 3 106 in FIG. 1 or the third vehicle 206 and/or the fourth vehicle 208 in FIG. 2).

The apparatus may include additional modules that perform each of the steps of the algorithm in the aforementioned flow chart of FIG. 4. As such, each step in the aforementioned flow chart of FIG. 4 may be performed by a module and the apparatus may include one or more of those modules. The modules may be one or more hardware components specifically configured to carry out the stated processes/algorithm, implemented by a processor configured to perform the stated processes/algorithm, stored within a computer-readable medium for implementation by a processor, or some combination thereof.

Figure 6:
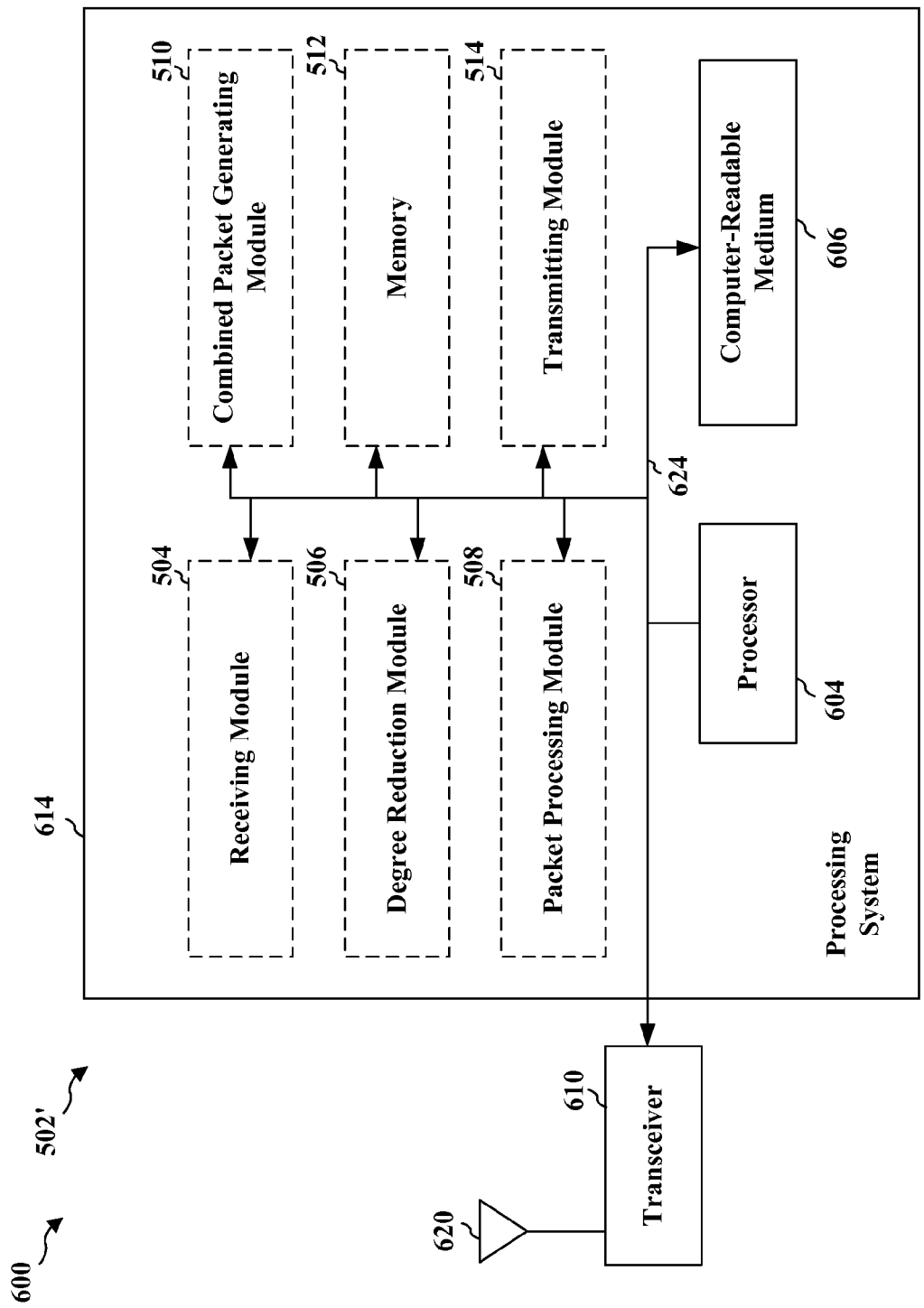
FIG. 6 is a diagram illustrating an example of a hardware implementation for an apparatus employing a processing system.

FIG. 6 is a diagram 600 illustrating an example of a hardware implementation for an apparatus 502' employing a processing system 614. The processing system 614 may be implemented with a bus architecture, represented generally by the bus 624. The bus 624 may include any number of interconnecting buses and bridges depending on the specific application of the processing system 614 and the overall design constraints. The bus 624 links together various circuits including one or more processors and/or hardware modules, represented by the processor 604, the modules 504, 506, 508, 510, 512, 514 and the computer-readable medium 606. The bus 624 may also link various other circuits such as timing sources, peripherals, voltage regulators, and power management circuits, which are well known in the art, and therefore, will not be described any further.

The processing system 614 may be coupled to a transceiver 610. The transceiver 610 is coupled to one or more antennas 620. The transceiver 610 provides a means for communicating with various other apparatus over a transmission medium. The transceiver 610 receives a signal from the one or more antennas 620, extracts information from the received signal, and provides the extracted information to the processing system 614, specifically the receiving module 504. In addition, the transceiver 610 receives information from the processing system 614, specifically the transmitting module 514, and based on the received information, generates a signal to be applied to the one or more antennas 620. The processing system 614 includes a processor 604 coupled to a computer-readable medium 606. The processor 604 is responsible for general processing, including the execution of software stored on the computer-readable medium 606. The software, when executed by the processor 604, causes the processing system 614 to perform the various functions described supra for any particular apparatus. The computer-readable medium 606 may also be used for storing data that is manipulated by the processor 604 when executing software. The processing system further includes at least one of the modules 504, 506, 508, 510, 512, and 514. The modules may be software modules running in the processor 604, resident/stored in the computer readable medium 606, one or more hardware modules coupled to the processor 604, or some combination thereof.

In one configuration, the apparatus 602/602' for relaying a packet includes means for receiving at least one packet, means for reducing a degree of the at least one packet, means for processing the at least one packet based on the reduced degree, means for generating a combined packet, the means for generating configured to combine the at least one processed packet with at least one other processed packet based on the reduced degree and a weight of each of the processed packets, means for diversifying the combined packet, configured to replace a native packet in the combined packet with another native packet from the decoded set of native packets and replace any native packet in the combined packet with another native packet that belongs to a same equivalence class, and means for transmitting the combined packet. The aforementioned means may be one or more of the aforementioned modules of the apparatus 502 and/or the processing system 614 of the apparatus 502' configured to perform the functions recited by the aforementioned means.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method of relaying a packet, comprising:
   receiving at least one packet;
   reducing a degree of the at least one packet, the reduction of the degree including removing any combination of two native packets of the least one packet that belong to a same equivalence class;
   processing the at least one packet based on the reduced degree;
   generating a combined packet, the generating comprising combining the at least one processed packet with at least one other processed packet based on the reduced degree and a weight of each of the processed packets; and
   transmitting the combined packet.

2. The method of claim 1, wherein the at least one packet received is encoded using a fountain code.

3. The method of claim 1, wherein the degree of the at least one packet comprises a number of native packets used to create the at least one packet.

4. The method of claim 1, the reducing further comprising:
   removing all native packets of the at least one packet that belong to a decoded set of native packets.

5. The method of claim 4, wherein an equivalence class comprises a set of native packets, wherein an exclusive-or operation of any two native packets in the equivalence class can be generated by performing an exclusive-or operation on degree-2 processed packets.

6. The method of claim 4, the processing comprising:
   determining the reduced degree of the at least one packet;
   when the reduced degree of the at least one packet is equal to one, the processing further comprising:
      updating the decoded set with the at least one degree-reduced packet;
      updating the decoded set based on belief propagation, and
      updating equivalence classes based on the at least one degree-reduced packet; and
   when the reduced degree of the at least one packet is equal to two, the processing further comprising updating the equivalence classes based on the at least one degree-reduced packet.

7. The method of claim 6, the generating the combined packet further comprising:
   determining a target degree for the combined packet;
   selecting at least one degree-reduced packet having a degree less than or equal to the target degree based on a weight assigned to each packet of the at least one packet; and
   combining each of the at least one selected degree-reduced packet to generate the combined packet.

8. The method of claim 7, wherein the at least one degree-reduced packet is selected until a sum of respective degrees of selected packets is equal to the target degree, or until a maximum number of selections has occurred.

9. The method of claim 7, further comprising:
   diversifying the combined packet comprising:
      replacing a native packet in the combined packet with another native packet from the decoded set of native packets, and
      replacing any native packet in the combined packet with another native packet that belongs to a same equivalence class.

10. An apparatus for relaying a packet, comprising:
    means for receiving at least one packet;
    means for reducing a degree of the at least one packet, the means for reducing the degree configured to remove any combination of two native packets of the least one packet that belong to a same equivalence class;
    means for processing the at least one packet based on the reduced degree;
    means for generating a combined packet, the means for generating configured to combine the at least one processed packet with at least one other processed packet based on the reduced degree and a weight of each of the processed packets; and
    means for transmitting the combined packet.

11. The apparatus of claim 10, wherein the at least one packet received is encoded using a fountain code.

12. The apparatus of claim 10, wherein the degree of the at least one packet comprises a number of native packets used to create the at least one packet.

13. The apparatus of claim 10, the means for reducing further configured to:
    remove all native packets of the at least one packet that belong to a decoded set of native packets.

14. The apparatus of claim 13, wherein an equivalence class comprises a set of native packets, wherein an exclusive-or operation of any two native packets in the equivalence class can be generated by performing an exclusive-or operation on degree-2 processed packets.

15. The apparatus of claim 13, the means for processing configured to:
    determine the reduced degree of the at least one packet;
    when the reduced degree of the at least one packet is equal to one, the means for processing further configured to:
       update the decoded set with the at least one degree-reduced packet;
       update the decoded set based on belief propagation, and
       update equivalence classes based on the at least one degree-reduced packet; and
    when the reduced degree of the at least one packet is equal to two, the means for processing further configured to update the equivalence classes based on the at least one degree-reduced packet.

16. The apparatus of claim 15, the means for generating the combined packet further configured to:
  determine a target degree for the combined packet;
  select at least one degree-reduced packet having a degree less than or equal to the target degree based on a weight assigned to each packet of the at least one packet; and
  combine each of the at least one selected degree-reduced packet to generate the combined packet.

17. The apparatus of claim 16, wherein the at least one degree-reduced packet is selected until a sum of respective degrees of selected packets is equal to the target degree, or until a maximum number of selections has occurred.

18. The apparatus of claim 16, further comprising:
  means for diversifying the combined packet, configured to:
    replace a native packet in the combined packet with another native packet from the decoded set of native packets, and
    replace any native packet in the combined packet with another native packet that belongs to a same equivalence class.

19. An apparatus for relaying a packet, comprising:
  a memory; and
  at least one processor coupled to the memory and configured to:
    receive at least one packet;
    reduce a degree of the at least one packet, the reduction of the degree including removal of any combination of two native packets of the least one packet that belong to a same equivalence class;
    process the at least one packet based on the reduced degree;
    generate a combined packet, wherein the at least one processor configured to generate is further configured to combine the at least one processed packet with at least one other processed packet based on the reduced degree and a weight of each of the processed packets; and
    transmit the combined packet.

20. The apparatus of claim 19, wherein the at least one packet received is encoded using a fountain code.

21. The apparatus of claim 19, wherein the degree of the at least one packet comprises a number of native packets used to create the at least one packet.

22. The apparatus of claim 19, wherein the at least one processor configured to reduce is further configured to:
  remove all native packets of the at least one packet that belong to a decoded set of native packets.

23. The apparatus of claim 22, wherein an equivalence class comprises a set of native packets, wherein an exclusive-or operation of any two native packets in the equivalence class can be generated by performing an exclusive-or operation on degree-2 processed packets.

24. The apparatus of claim 22, wherein the at least one processor configured to process is further configured to:
  determine the reduced degree of the at least one packet;
  when the reduced degree of the at least one packet is equal to one, e at least one processor configured to process is further configured to:
    update the decoded set with the at least one degree-reduced packet;
    update the decoded set based on belief propagation, and update equivalence classes based on the at least one degree-reduced packet; and
  when the reduced degree of the at least one packet is equal to two, the at least one processor configured to process is further configured to update the equivalence classes based on the at least one degree-reduced packet.

25. The apparatus of claim 24, wherein the at least one processor configured to generate the combined packet is further configured to:
  determine a target degree for the combined packet;
  select at least one degree-reduced packet having a degree less than or equal to the target degree based on a weight assigned to each packet of the at least one packet; and
  combine each of the at least one selected degree-reduced packet to generate the combined packet.

26. The apparatus of claim 25, wherein the at least one degree-reduced packet is selected until a sum of respective degrees of selected packets is equal to the target degree, or until a maximum number of selections has occurred.

27. The apparatus of claim 25, wherein the at least one processor is further configured to:
  diversify the combined packet, wherein the at least one processor configured to diversify is further configured to:
    replace a native packet in the combined packet with another native packet from the decoded set of native packets, and
    replace any native packet in the combined packet with another native packet that belongs to a same equivalence class.

28. A non-transitory computer-readable medium including computer-executable code, comprising code for:
  receiving at least one packet;
  reducing a degree of the at least one packet, the reduction of the degree including removing any combination of two native packets of the least one packet that belong to a same equivalence class;
  processing the at least one packet based on the reduced degree;
  generating a combined packet, the generating comprising combining the at least one processed packet with at least one other processed packet based on the reduced degree and a weight of each of the processed packets; and
  transmitting the combined packet.

* * * * *